(12) United States Patent
Maruya et al.

(10) Patent No.: US 11,004,821 B2
(45) Date of Patent: May 11, 2021

(54) WIRE BONDING METHOD AND WIRE BONDING APPARATUS

(71) Applicant: SHINKAWA LTD., Tokyo (JP)

(72) Inventors: Yusuke Maruya, Tokyo (JP); Yuki Sekine, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 278 days.

(21) Appl. No.: 16/327,338

(22) PCT Filed: Aug. 22, 2017

(86) PCT No.: PCT/JP2017/029976
§ 371 (c)(1),
(2) Date: May 29, 2019

(87) PCT Pub. No.: WO2018/038113
PCT Pub. Date: Mar. 1, 2018

(65) Prior Publication Data
US 2019/0287941 A1 Sep. 19, 2019

(30) Foreign Application Priority Data
Aug. 23, 2016 (JP) .............................. JP2016-162516

(51) Int. Cl.
*B23K 20/00* (2006.01)
*H01L 23/00* (2006.01)
*H01L 21/66* (2006.01)

(52) U.S. Cl.
CPC ............ *H01L 24/78* (2013.01); *B23K 20/007* (2013.01); *H01L 22/12* (2013.01); *H01L 24/43* (2013.01);
(Continued)

(58) Field of Classification Search
CPC ......... H01L 24/78; H01L 22/12; H01L 24/43; H01L 24/44; H01L 24/85;
(Continued)

(56) References Cited

U.S. PATENT DOCUMENTS 6,028,358 A * 2/2000 Suzuki .................... H01L 22/32
257/737
6,189,765 B1 2/2001 Moon
(Continued)

FOREIGN PATENT DOCUMENTS

JP 01199443 A * 8/1989 ............. H01L 24/78
JP 106181232 6/1994
(Continued)

OTHER PUBLICATIONS

"International Search Report (Form PCT/ISA/210) of PCT/JP2017/029976," dated Sep. 26, 2017, with English translation thereof, pp. 1-4.

Primary Examiner — Kiley S Stoner
(74) Attorney, Agent, or Firm — JCIPRNET

(57) ABSTRACT

A wire bonding method comprises: preparing a wire bonding apparatus; a step of forming a free air ball; a first height measuring step of measuring the height of a first electrode by detecting whether the free air ball is grounded to the first electrode; a second height measuring step of measuring the height of a second electrode by detecting whether the free air ball is grounded to the second electrode; a first bonding step of controlling the height of a bonding tool based on the measurement result in the first height measuring step, and bonding the free air ball to the first electrode; and a second bonding step of controlling the height of the bonding tool based on the measurement result in the second height measuring step, and bonding a wire to the second electrode
(Continued)

to connect the first and the second electrodes. Thus, electrodes can be correctly bonded.

12 Claims, 12 Drawing Sheets

(52) U.S. Cl.
CPC ............... *H01L 24/44* (2013.01); *H01L 24/85* (2013.01); *H01L 2224/32145* (2013.01); *H01L 2224/48091* (2013.01); *H01L 2224/48147* (2013.01); *H01L 2224/48227* (2013.01); *H01L 2224/48453* (2013.01); *H01L 2224/48465* (2013.01); *H01L 2224/73265* (2013.01); *H01L 2224/78301* (2013.01); *H01L 2224/85181* (2013.01)

(58) Field of Classification Search
CPC .......... H01L 2224/32145; H01L 2224/48091; H01L 2224/48147; H01L 2224/48227; H01L 2224/48453; H01L 2224/48465; H01L 2224/73265; H01L 2224/78301; H01L 2224/85181; H01L 2224/85045; H01L 2224/78271; H01L 2224/48145; H01L 2224/78353; H01L 2924/00014; H01L 22/26; H01L 22/14; B23K 20/007; B23K 2101/42; B23K 2103/08; B23K 2103/12; B23K 20/26; B23K 20/233; B23K 20/004; B23K 20/005
USPC ...................... 228/4.5, 180.5, 102–103, 8–12
See application file for complete search history.

(56) References Cited

U.S. PATENT DOCUMENTS

| | | | | |
|---|---|---|---|---|
| 6,474,538 | B1* | 11/2002 | Yonezawa | H01L 24/78 228/180.5 |
| 7,478,741 | B1* | 1/2009 | Newman | G01R 31/71 228/103 |
| 2001/0004991 | A1* | 6/2001 | Mochida | H01L 24/78 228/103 |
| 2005/0194422 | A1* | 9/2005 | Takahashi | H01L 24/11 228/8 |
| 2006/0079008 | A1* | 4/2006 | Nishimaki | H01L 24/85 438/11 |
| 2011/0062216 | A1* | 3/2011 | Sano | H01L 24/85 228/102 |
| 2013/0180957 | A1* | 7/2013 | Lee | B23K 20/007 219/69.12 |
| 2013/0256385 | A1 | 10/2013 | Sugito | |
| 2014/0209663 | A1* | 7/2014 | Song | H01L 24/78 228/102 |
| 2015/0008251 | A1* | 1/2015 | Song | H01L 24/78 228/41 |
| 2015/0303169 | A1* | 10/2015 | Tran | H01L 24/48 257/780 |
| 2020/0006161 | A1* | 1/2020 | Gillotti | H01L 24/85 |

FOREIGN PATENT DOCUMENTS

| | | | | |
|---|---|---|---|---|
| JP | 07324906 | A * | 12/1995 | ............ H01L 24/78 |
| JP | H09260415 | | 10/1997 | |
| JP | H1126496 | | 1/1999 | |
| JP | H11330168 | | 11/1999 | |
| JP | 2000223524 | A * | 8/2001 | ............ H01L 24/78 |
| JP | 2002076049 | | 3/2002 | |
| JP | 2004273507 | | 9/2004 | |
| JP | 2011254053 | A * | 12/2011 | |
| JP | 2013074111 | | 4/2013 | |

* cited by examiner

WIRE BONDING METHOD AND WIRE BONDING APPARATUS

CROSS-REFERENCE TO RELATED APPLICATION

This application is a 371 application of the International PCT application serial no. PCT/JP2017/029976, filed on Aug. 22, 2017, which claims the priority benefit of Japan Patent Application No. 2016-162516, filed on Aug. 23, 2016. The entirety of each of the above-mentioned patent applications is hereby incorporated by reference herein and made a part of this specification.

BACKGROUND

Technical Field

The present invention relates to a wire bonding method and a wire bonding apparatus.

Description of Related Art

Conventionally, in the manufacturing method of a semiconductor device, for example, wire bonding in which the two points of an electrode of a semiconductor chip and an electrode of a substrate are electrically connected by a wire is widely used. In the wire bonding, a ball part is formed at the front end of the wire extending from the front end of a bonding tool by electrical discharge or the like, and the bonding tool is lowered toward the bonding point of the semiconductor device. The ball part disposed on the bonding point is pressed by the bonding tool, and ultrasonic vibrations or the like is supplied at the same time to bond the two.

Regarding this, Patent Document 1 discloses a wire bonder with a bond level automatic adjustment function. In the wire bonder for connecting pads of an LSI with external leads by conductor wires, the wire bonder has a function of measuring the heights of the pad and the lead at the time of bonding, and the wire bonder calculates the heights of the pads and the leads other than the measured parts from the measured heights and coordinates of the pads and the leads, thereby performing the bonding at an appropriate bonding level.

PRIOR ART DOCUMENT

Patent Document

Patent Document 1: Japanese Laid-open No. H6-181232

SUMMARY

Technical Problem

However, when the diameter of the ball part of the wire is small, or when the bonding target is set obliquely and the height of each bonding point is not uniform, it may occur that the height of each bonding point cannot be correctly measured, and the bonding cannot be performed correctly.

The present invention has been made in view of above descriptions, and an object thereof is to provide a wire bonding method and a wire bonding apparatus that can correctly bond a plurality of electrodes.

Solution to the Problem

A wire bonding method according to an aspect of the present invention includes: a step of preparing a wire bonding apparatus including a bonding tool and a bonding stage, wherein the bonding tool is configured to allow a wire to be inserted, and the bonding stage fixes and holds a workpiece including a first electrode and a second electrode; a ball forming step of forming a free air ball at a front end of a wire inserted in the bonding tool; a first height measuring step of measuring a height of the first electrode by detecting whether the free air ball is grounded to the first electrode; a second height measuring step of measuring a height of the second electrode by detecting whether the free air ball is grounded to the second electrode; a first bonding step of bonding the free air ball to the first electrode by controlling a height of the bonding tool based on a measurement result of the first height measuring step; and a second bonding step of bonding the wire to the second electrode by controlling a height of the bonding tool based on a measurement result of the second height measuring step to connect the first electrode and the second electrode.

In the above wire bonding method, the first height measuring step and the second height measuring step may include detecting whether the free air ball at the front end of the wire is grounded to the first electrode and the second electrode, respectively, based on a change in a bonding load applied to the free air ball when the free air ball at the front end of the wire presses the first electrode and the second electrode, respectively.

In the above wire bonding method, the first height measuring step and the second height measuring step may include detecting whether the free air ball at the front end of the wire is grounded to the first electrode and the second electrode, respectively, based on an output change in a predetermined electric signal supplied to the wire inserted in the bonding tool when the free air ball at the front end of the wire contacts the first electrode and the second electrode, respectively.

In the above wire bonding method, the predetermined electric signal is a DC voltage signal or an AC voltage signal, and the first height measuring step and the second height measuring step may include detecting whether the free air ball at the front end of the wire is grounded to the first electrode and the second electrode based on a change in a potential difference between the wire and the first electrode and between the wire and the second electrode.

A wire bonding apparatus according to an aspect of the present invention includes: a bonding tool configured to allow a wire to be inserted, wherein a free air ball is formed at a front end of the wire; a bonding stage for fixing and holding a workpiece which includes a first electrode and a second electrode; a first height measuring part for measuring a height of the first electrode by detecting whether the free air ball is grounded to the first electrode; a second height measuring part for measuring a height of the second electrode by detecting whether the free air ball is grounded to the second electrode; a first bonding part for bonding the free air ball to the first electrode by controlling a height of the bonding tool based on a measurement result of the first height measuring part; and a second bonding part for bonding the wire to the second electrode by controlling a height of the bonding tool based on a measurement result of the second height measuring part to connect the first electrode and the second electrode.

In the above wire bonding apparatus, the first height measuring part and the second height measuring part may detect whether the free air ball at the front end of the wire is grounded to the first electrode and the second electrode, respectively, based on a change in a bonding load applied to the free air ball when the free air ball presses the first electrode or the second electrode.

In the above wire bonding apparatus, the first height measuring part and the second height measuring part may detect whether the free air ball at the front end of the wire is grounded to the first electrode and the second electrode, respectively, based on an output change in a predetermined electric signal supplied to the wire inserted in the bonding tool when the free air ball contacts the first electrode or the second electrode.

In the above wire bonding apparatus, the predetermined electric signal is an AC voltage signal, and the first and the second height measuring parts may respectively detect whether the free air ball at the front end of the wire is grounded to the first electrode and the second electrode based on a change in a potential difference between the wire and the first electrode and between the wire and the second electrode.

Effects

According to the present invention, a plurality of electrodes can be correctly bonded.

DESCRIPTION OF THE EMBODIMENTS

Embodiments of the present invention will be described below. In the following description of the drawings, the same or similar components are denoted by the same or similar symbols. The drawings are exemplary and schematically indicate the size or shape of each part, and the technical scope of the present invention shall not be construed to be limited to the embodiments.

First Embodiment

Figure 1:
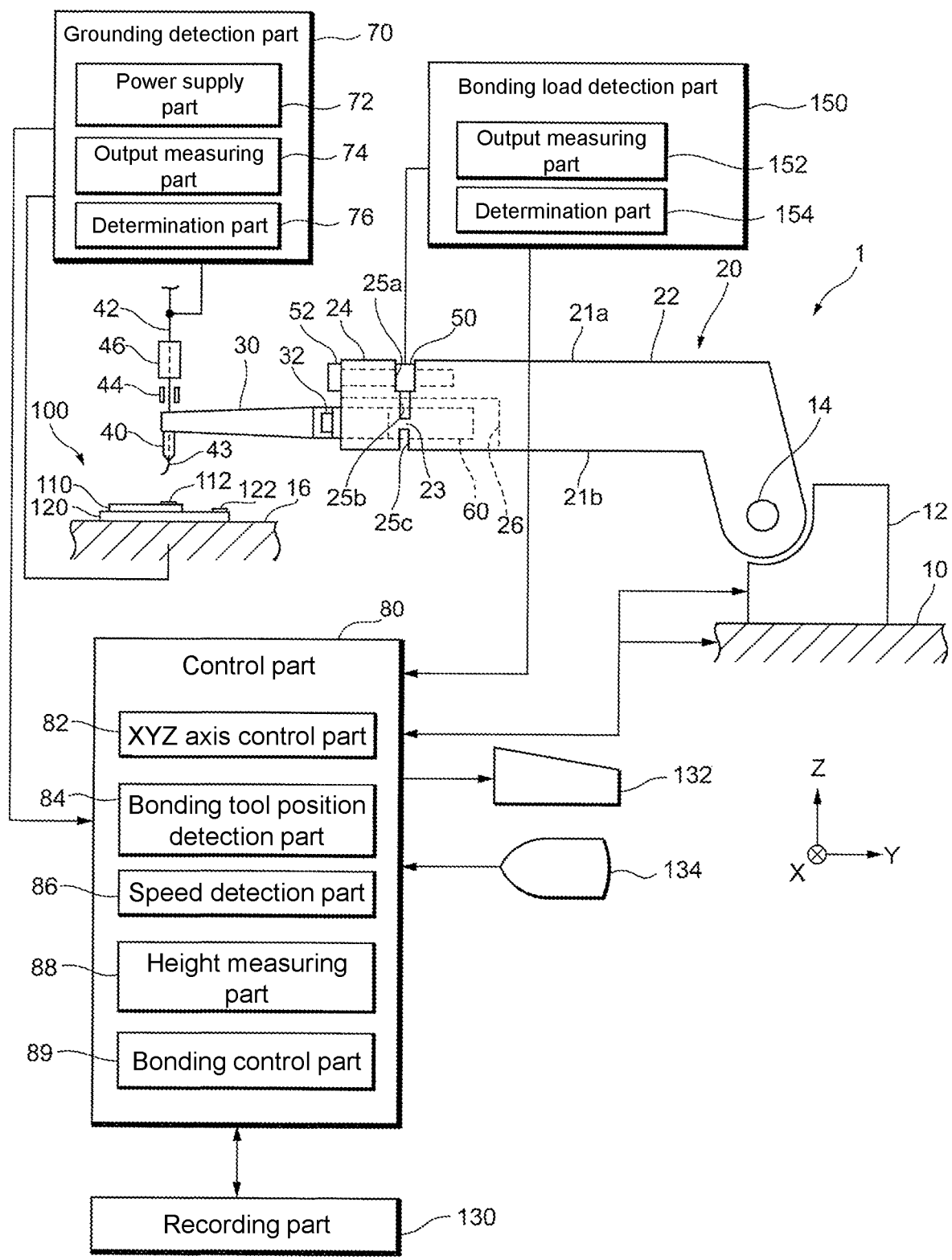
FIG. 1 is a view showing a wire bonding apparatus according to the first embodiment.
Figure 2A:
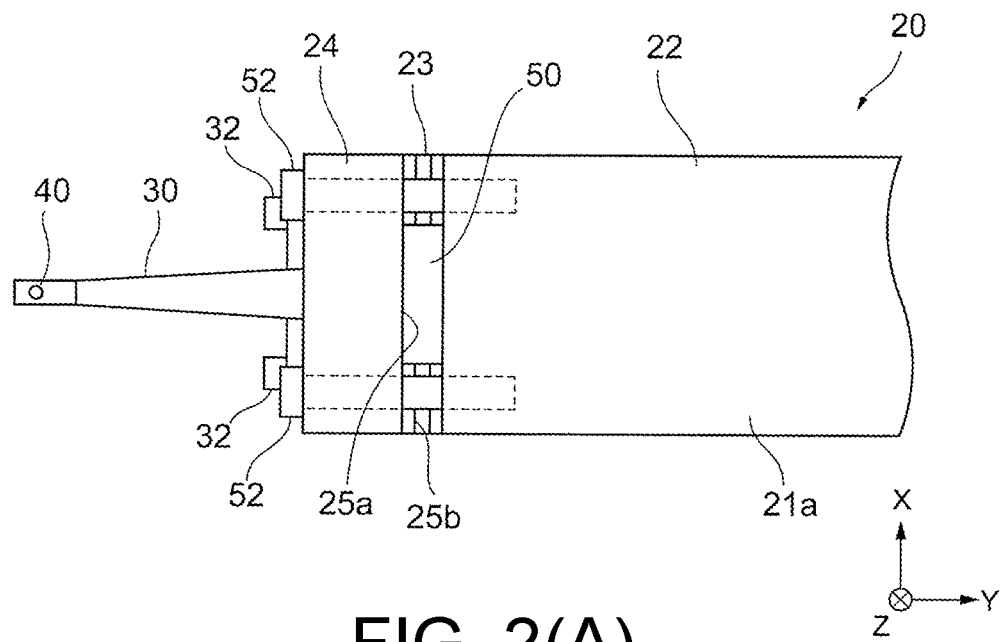
FIGS. 2(A) and 2(B) are a top view and a bottom view of a plane of the bonding arm of the wire bonding apparatus according to the first embodiment.
Figure 2B:
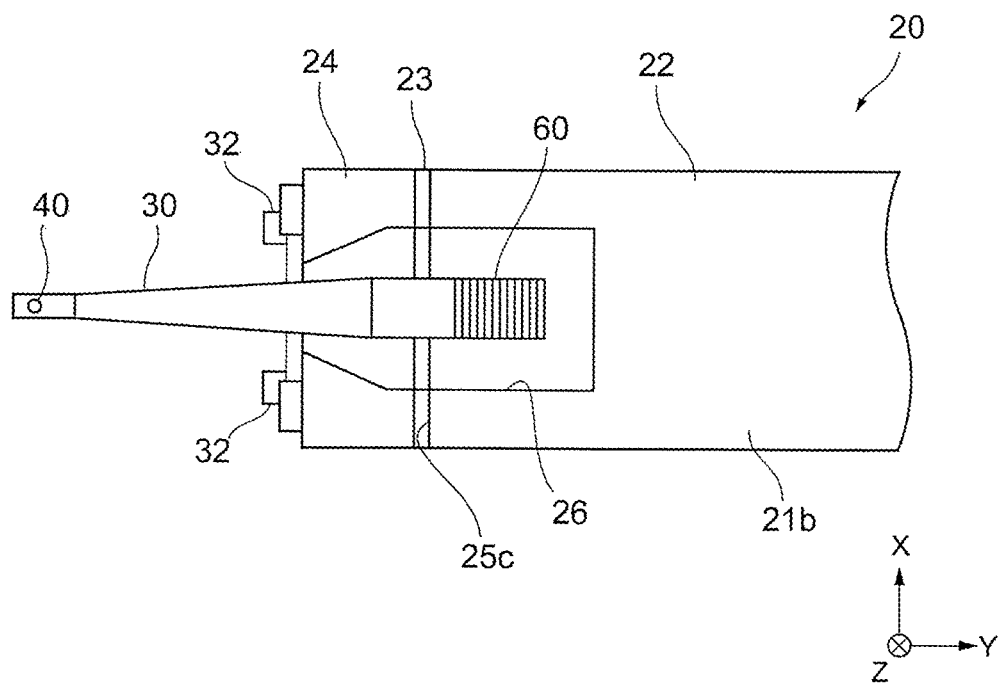

FIG. 1 is a view showing a wire bonding apparatus according to the embodiment. FIGS. 2(A) and 2(B) are partial enlarged views of a bonding arm in the wire bonding apparatus, and FIG. 2(A) is a top view of the bonding arm, and FIG. 2(B) is a bottom view of the bonding arm.

As shown in FIG. 1, a wire bonding apparatus 1 includes, for example, an XY driving mechanism 10, a Z driving mechanism 12, a bonding arm 20, an ultrasonic horn 30, a bonding tool 40, a load sensor 50, a bonding load detection part 150, an ultrasonic vibrator 60, a grounding detection part 70, a control part 80, and a recording part 130.

The XY drive mechanism 10 is configured to be slidable in the XY direction (a direction parallel to a bonding surface), and a Z driving mechanism (linear motor) 12 that allows the bonding arm 20 to swing toward the Z direction (a direction perpendicular to the bonding surface) is provided on the XY driving mechanism (linear motor) 10.

The bonding arm 20 is supported by a support shaft 14 and is configured to be swingable with respect to the XY driving mechanism 10. The bonding arm 20 is formed in a substantially rectangular parallelepiped shape by extending from the XY driving mechanism 10 to a bonding stage 16 on which a semiconductor chip 110 is placed, and the semiconductor chip is mounted on, for example, a substrate 120 that is a lead frame. The bonding arm 20 includes an arm base end part 22 mounted to the XY driving mechanism 10, an arm front end part 24 located on the front end side of the arm base end part 22 and mounted with the ultrasonic horn 30, and a connecting part 23 which connects the arm base end part 22 and the arm front end part 24 and has flexibility. The connecting part 23 is configured by slits 25a, 25b and 25c, wherein the slits 25a and 25b have a predetermined width and extend from a top surface 21a of the bonding arm 20 toward a bottom surface 21b of the bonding arm 20, and the slit 25c has a predetermined width and extends from the bottom surface 21b of the bonding arm 20 toward the top surface 21a of the bonding arm 20. In this way, since the connecting part 23 is configured by the slits 25a, 25b and 25c partially as a thin wall part, the arm front end part 24 is configured to be bent with respect to the arm base end part 22.

As shown in FIGS. 1 and 2(B), a concave part 26 for receiving the ultrasonic horn 30 is formed on the side of the bottom surface 21b of the bonding arm 20. The ultrasonic horn 30 is mounted on the arm front end part 24 by horn fixing screws 32 in a state of being received in the concave part 26 of the bonding arm 20. The ultrasonic horn 30 holds the bonding tool 40 at a front end part that protrudes from the concave part 26, and the ultrasonic vibrator 60 that generates ultrasonic vibrations is provided in the concave part 26. The ultrasonic vibrations are generated by the ultrasonic vibrator 60, and the ultrasonic vibrations are transmitted to the bonding tool 40 by the ultrasonic horn 30, so that ultrasonic vibrations can be imparted to the bonding target via the bonding tool 40. The ultrasonic vibrator 60 is, for example, a piezoelectric vibrator.

Further, as shown in FIGS. 1 and 2(A), the slits 25a and 25b are formed on the side of the top surface 21a of the bonding arm 20 sequentially from the top surface 21a toward the bottom surface 21*b*. The upper slit 25*a* is formed to have a width wider than that of the lower slit 25*b*. Further, the load sensor 50 is provided in the upper slit 25*a* formed to have a wider width. The load sensor 50 is fixed to the arm front end part 24 by preloading screws 52. The load sensor 50 is disposed so as to be sandwiched between the arm base end part 22 and the arm front end part 24. In other words, the load sensor 50 is mounted with offset from the central axis of the longitudinal direction of the ultrasonic horn 30 to the contact/separation direction with respect to the bonding target and is mounted between the rotation center of the bonding arm 20 and the mounting surface of the ultrasonic horn 30 in the arm front end part 24 (i.e., the front end surface of the arm front end part 24 on the side of the bonding tool 40). Further, as described above, since the ultrasonic horn 30 holding the bonding tool 40 is mounted to the arm front end part 24, when a load is applied to the front end of the bonding tool 40 by a reaction force from the bonding target, the arm front end part 24 bends with respect to the arm base end part 22 so that the load can be detected by the load sensor 50. The load sensor 50 is, for example, a piezoelectric load sensor.

Figure 5A:
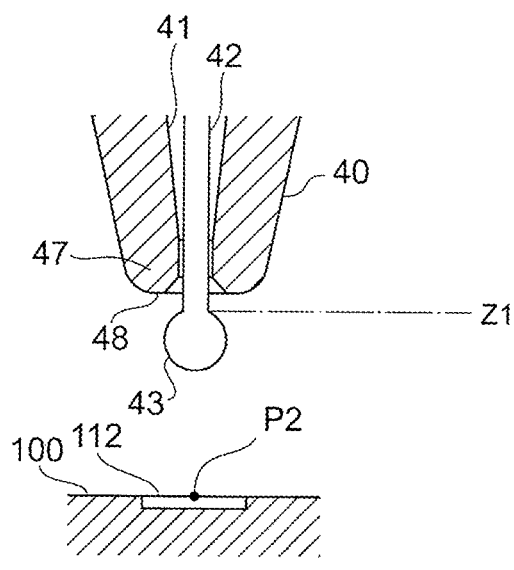
FIGS. 5(A) to 5(C) are views for explaining the height measuring processing of the wire bonding according to the first embodiment.

The bonding tool 40 is for inserting a wire 42 and is, for example, a capillary provided with an insertion hole 41 (please refer to FIG. 5(A)). In this case, it is configured that the wire 42 used for bonding is inserted into the insertion hole 41 of the bonding tool 40 and that a part of the wire 42 may extrude from the front end of the bonding tool 40. Further, a pressing part 47 (please refer to FIG. 5(A)) for pressing the wire 42 is provided at the front end of the bonding tool 40. The pressing part 47 has a shape that is rotationally symmetrical about the direction of the insertion hole 41 of the bonding tool 40 and has a pressing surface 48 (please refer to FIG. 5(A)) on the lower surface around the insertion hole 41.

The bonding tool 40 is mounted to the ultrasonic horn 30 in a way replaceable by elastic deformation of the ultrasonic horn 30 itself. Further, a wire clamper 44 is provided above the bonding tool 40, and the wire clamper 44 is configured to restrain or release the wire 42 at a predetermined timing. A wire tensioner 46 is provided further above the wire clamper 44, and the wire tensioner 46 is configured to allow the wire 42 to be inserted and to provide an appropriate tension to the wire 42 being bonded.

The material of the wire 42 is appropriately selected based on the easiness of processing, low electric resistance, and the like, and for example, gold (Au), copper (Cu), silver (Ag) or the like is used. Further, the wire 42 is bonded to an electrode 112 of the semiconductor chip 110 by a free air ball 43 extending from the front end of the bonding tool 40.

The grounding detection part 70 electrically detects whether the free air ball 43, which is the front end of the wire 42 inserted to the bonding tool 40, is grounded to the electrode 112 of the semiconductor chip 110 and detects whether the wire 42 is grounded to the electrode 112 based on an output of an electric signal supplied to the wire 42.

The grounding detection part 70 includes, for example, a power supply part 72 for applying a predetermined electric signal between a workpiece 100 and the wire 42, an output measuring part 74 for measuring the output of the electric signal supplied from the power supply part 72, and a determination part 76 for determining whether the wire 42 is grounded to the workpiece 100 based on the measurement result of the output measuring part 74. As shown in FIG. 1, one of the terminals of the grounding detection part 70 is electrically connected to the bonding stage 16, and the other terminal is electrically connected to the wire clamper 44 (or a wire spool (omitted in FIG. 1)).

The control part 80 is configured to perform control for the bonding processing and is exemplified by being connected among structures such as the XY driving mechanism 10, the Z driving mechanism 12, the ultrasonic horn 30 (the ultrasonic vibrator 60), the bonding tool 40, the bonding load detection part 150 (the load sensor 50), and the grounding detection part 70 in a way capable of directly or indirectly transmitting and receiving signals, and the operations of these structures are controlled by the control part 80.

The control part 80 is configured by, for example, including an XYZ axis control part 82, a bonding tool position detection part 84, a speed detection part 86, a height measuring part 88, and a bonding control part 89.

The XYZ axis control part 82 controls the XYZ-direction operation of the bonding arm 20 or the bonding tool 40 by, for example, controlling at least one of the XY driving mechanism 10 and the Z driving mechanism 12.

The bonding tool position detection part 84 detects the position of the bonding tool 40 including the position of the bonding tool 40 in the Z direction, such as the position of the front end of the bonding tool 40. The position of the front end of the bonding tool 40 may include, for example, the position of the front end of the bonding tool 40 itself, the position of the front end of a wire inserted in the bonding tool, or the position of the free air ball 43 formed at the front end of the wire inserted in the bonding tool. By providing the bonding tool position detection part 84, the distance between the position before the bonding tool 40 is moved (the height of the bonding tool 40) and the position after the bonding tool 40 is moved, such as the position of the bonding tool 40 (the height of the bonding target) when the free air ball 43 is grounded to the bonding target, can thereby be correctly measured.

The speed detection part 86 detects the moving speed of the bonding tool 40. The speed detection part 86 may, for example, detect the moving speed of the bonding tool 40 at all times and may periodically detect the moving speed of the bonding tool 40.

The height measuring part 88 measures the height of each bonding target by, for example, detecting whether the free air ball 43 formed at the front end of the wire 42 inserted in the bonding tool 40 is grounded to each of the bonding targets.

The bonding control part 89, for example, controls the height of the bonding tool 40 based on the measurement result of the height measuring part 88 to bond the free air ball 43 at the front end of the wire 42 to the electrode 112 of the semiconductor chip 110 and controls the height of the bonding tool 40 based on the measurement result of the height measuring part 88 to bond the wire 42 to the electrode 122 of the substrate 120 to connect the electrode 112 and the electrode 122.

The control part 80 is connected to the recording part 130 which records various kinds of information. For example, the recording part 130 records the position information of each of the plurality of electrodes 112 and 122 that are disposed. The recording part 130 records the front end position information of the bonding tool 40, such as disposition position information when the bonding tool 40 is lowered to the electrodes 112 and 122 (the positions P1 and P3 shown in FIG. 3). The recording part 130 records the moving speed of the bonding tool 40 for the distance measuring part 88 to determine that the free air ball 43 has been grounded to the bonding point or records the change amount in the moving speed of the bonding tool 40 as a threshold value. The recording part 130 records the output value of the load sensor 50 which is set in advance and is referred to for determining whether the free air ball 43 is grounded as a threshold value.

Further, the control part 80 is connected to an operation part 132 for inputting control information and a display part 134 for outputting the control information, whereby an operator can input the necessary control information with the operation part 132 while recognizing the screen with the display part 134. Further, the control part 80 is a computer device including a CPU, a memory, and the like. The memory stores in advance a bonding program for performing the necessary processes for wire bonding and the like. The control part 80 is configured to perform each step for controlling the operation of the bonding tool 40 described in the distance measuring method of the wire bonding to be described later (such as including a program for causing a computer to perform each step).

An outline of the wire bonding operation according to the embodiment will be described with reference to FIG. 3. The wire bonding operation includes at least a height measuring processing for measuring the height of each of the electrodes 112 and 122 and a wire bonding processing for bonding the electrodes 112 and 122 with the wire performed by the wire bonding apparatus.

Figure 3A:
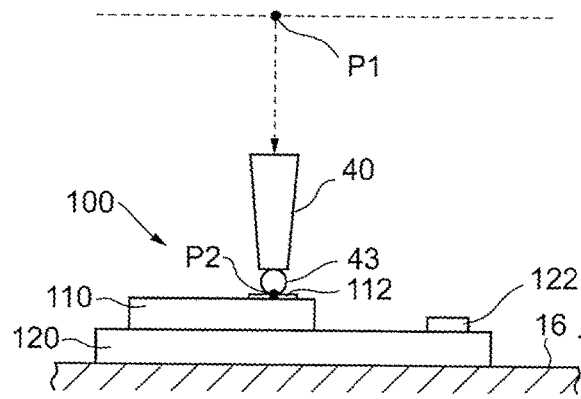
FIGS. 3(A) to 3(D) are views for explaining the operation of the wire bonding according to the first embodiment.
Figure 3B:
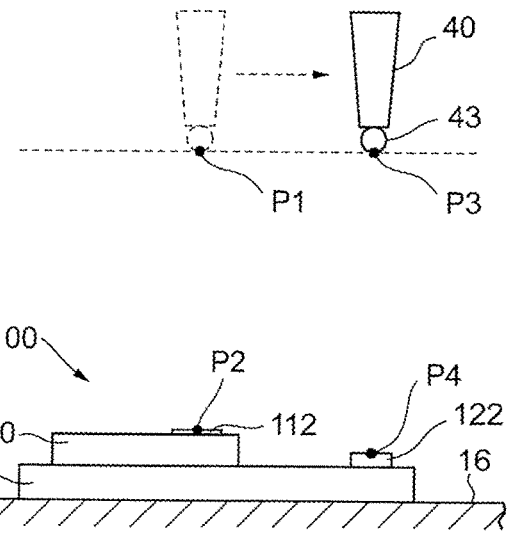
Figure 3C:
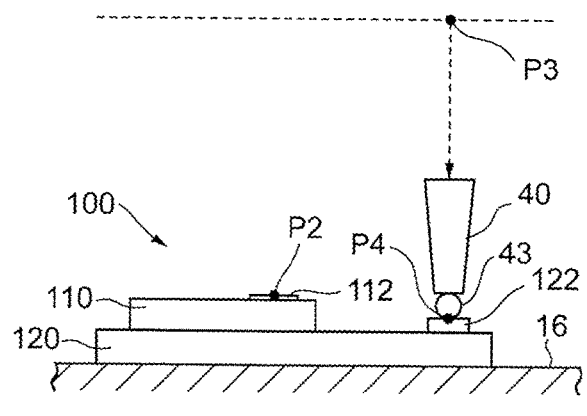
Figure 3D:
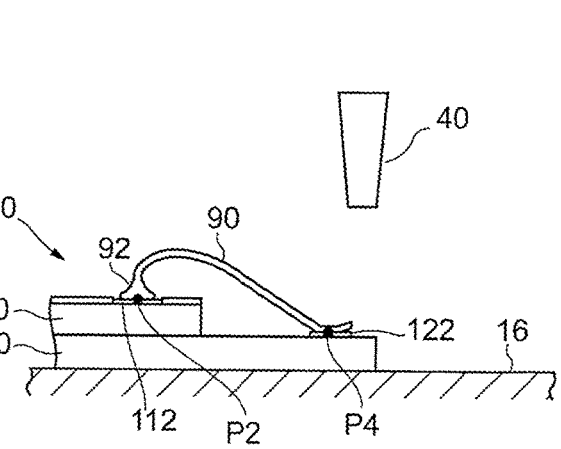

FIGS. 3(A) to 3(D) are conceptual views illustrating an example of an operation for performing wire bonding to the plurality of electrodes 112 and 122. FIGS. 3(A) to 3(C) show an example of the height measuring processing for measuring the height of each of the electrodes 112 and 122, and FIG. 3(D) shows an example of performing the bonding processing for the wire bonding on the plurality of electrodes.

As shown in FIG. 3(A), the wire bonding apparatus 1 is provided as a premise; as shown in FIG. 1, the wire bonding apparatus 1 includes the bonding tool 40 configured to allow the wire 42 to be inserted; and the bonding stage 16 for fixing and holding the workpiece 100 including the electrode 112 (first electrode) and the electrode 122 (second electrode).

The workpiece 100 is prepared, and the workpiece 100 has the substrate 120, on which the electrode 112 is formed, and the semiconductor chip 110, which is mounted on the substrate 120 and on which the electrode 122 is formed; the workpiece 100 is transferred to the bonding stage 16 by a transferring device (not shown). The bonding stage 16 is attached to the lower surface of the workpiece 100 and fixes and holds the workpiece 100 by a wind clamper (not shown).

Here, the workpiece 100 has a first bonding point P2, which is electrically bonded to the electrode 112 of the semiconductor chip 110 by a wire in a wire bonding method according to the embodiment, and a second bonding point P4, which is connected to the electrode 122 of the substrate 120. Here, the first bonding point refers to the part that is bonded first between the two points connected by the wire, and the second bonding point refers to the part that is bonded later.

In addition, the specific form of the workpiece 100 is not limited to the above, and the workpiece 100 may have various forms, such as electrically connecting electrodes between two points of a thing having a stack structure formed by stacking a plurality of semiconductor chips. Further, the first and second bonding targets are not necessarily a single electrode and may include a plurality of electrodes.

The free air ball 43 is formed at the front end of the wire 42 that is inserted in the bonding tool 40. Specifically, the front end of the wire 42 extending from the bonding tool 40 is brought close to a torch electrode (not shown) applied with a predetermined high voltage so that a discharge is generated between the front end of the wire 42 and the torch electrode. In this way, the free air ball 43 is formed at the front end of the wire 42 by the surface tension of the metal wire melting.

When the bonding tool 40 is lowered from the predetermined position P1 toward the first bonding point P2, the height measuring part 88 of the wire bonding apparatus 1 measures the height of the electrode 112 by detecting whether the free air ball 43 formed at the front end of the wire 42 inserted in the bonding tool 40 is grounded to the electrode 112. When the height measuring part 88 detects the grounding of the free air ball 43 to the electrode 112, the bonding tool 40 is raised toward the position P1.

Further, the height of the electrode 112 may include, for example, a height measured based on the height of a predetermined structure such as the bonding stage 16 or a relative height relative to a predetermined reference height.

As shown in FIG. 3(B), the bonding tool 40 is moved so that the bonding tool 40 is disposed from the position P1 to the position P3.

As shown in FIG. 3(C), when the bonding tool 40 is lowered from the predetermined position P3 toward the second bonding point P4, the height measuring part 88 measures the height of the electrode 122 by detecting whether the free air ball 43 formed at the front end of the wire 42 inserted in the bonding tool 40 is grounded to the electrode 122 of the substrate 120. When the height measuring part 88 detects the grounding of the free air ball 43 to the electrode 122, the bonding tool 40 is raised toward the position P3.

Further, the height of the electrode 122 may include, for example, a height measured based on the height of a predetermined structure such as the bonding stage 16 or a relative height relative to a predetermined reference height.

Further, when the height measuring processing ends, the bonding tool 40 returns to the position P1 and starts the bonding processing for bonding the wire to the electrodes 112 and 122.

As shown in FIG. 3(D), the bonding control part 89 of the wire bonding apparatus 1 calculates the movement trajectory from the first bonding point P2 of the electrode 112 toward the second bonding point P4 of the electrode 122 based on, for example, the measurement result of the height measuring part 88 and the detection result of the bonding tool position detection part 84. Further, the bonding control part 89 bonds the free air ball 43 at the front end of the wire 42 to the first bonding point P2 of the electrode 112 based on the movement trajectory and releases the wire 42 from the front end of the bonding tool 40 while causing the bonding tool 40 to move toward the electrode 122, so that a part of the wire 42 is bonded to the second bonding point P4 of the electrode 122.

Specifically, by appropriately operating the XY driving mechanism 10 and the Z driving mechanism 12, the wire 42 is released while the bonding tool 40 is moved along a predetermined trajectory, so that the wire 42 is looped from the first bonding point P2 of the electrode 112 toward the second bonding point P4 of the electrode 122. This is performed as follows: a first bonding of the free air ball 43 formed at the front end of the bonding tool 40 is performed at the first bonding point P2 of the electrode 112, and then the XY driving mechanism 10 and the Z driving mechanism 12 are looped to the second bonding point P4 a according to a predetermined trajectory, thereby performing a second bonding for a part of the wire 42 on the electrode 122. At this time, similar to the bonding at the first bonding point P2, a part of the wire 42 is pressed by the pressing part 47 (the pressing surface 48) of the bonding tool 40 (shown in FIG. 5 to be described later), and heat and/or the ultrasonic vibrations or the like is operated, whereby a part of the wire 42 is bonded to the second bonding point P4. As described above, the second bonding at the second bonding point P4 ends, and a wire loop 90 is formed between the first bonding point P2 and the second bonding point P4 to connect the two. A bonding part 92 of the wire loop 90 is provided at the first bonding point P2.

In this way, the workpiece having the wire loop 90 can be manufactured, and the wire loop 90 is formed into a predetermined shape for connecting the first bonding point P2 and the second bonding point P4.

Further, while the bonding tool 40 is lowered toward each of the bonding points P2 and P4, the ultrasonic vibrations can be supplied to the free air ball 43 of the wire 42. For example, by supplying the ultrasonic vibrations to the bonding tool 40 when the free air ball 43 of the wire 42 and the first bonding point P2 are in a non-contact state, the free air ball 43 of the wire 42 starts to contact the first bonding point P2 in a state that the free air ball 43 of the wire 42 vibrates. Therefore, especially when the wire 42 or the first bonding point P2 are, for example, an easily oxidizable material such as copper, the oxide formed on the surface of the first bonding point P2 and the surface of the free air ball 43 is removed by friction caused by the vibration, and a clean surface is exposed on the surface of the first bonding point P2 and the surface of the free air ball 43, respectively. In this way, the bonding state between the first bonding point P2 and the free air ball 43 is good, and the characteristics of the wire bonding can be improved.

The details of the height measuring processing for measuring the height of the bonding target will be described below.

Figure 4:
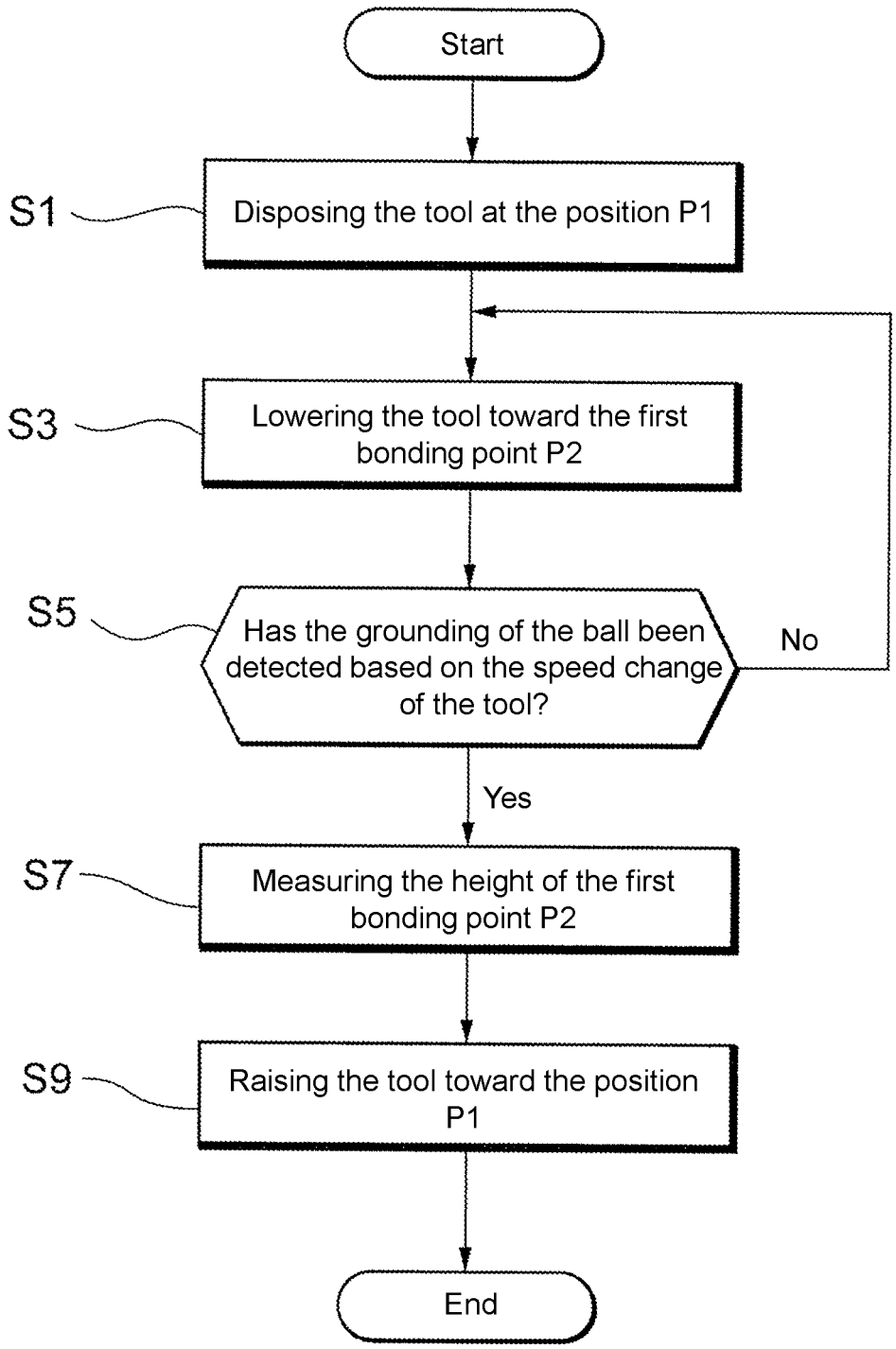
FIG. 4 is a flow chart showing an example of the height measuring processing of the wire bonding according to the first embodiment.

First, the height measuring processing of the first embodiment will be described with reference to FIGS. 4 to 6 (and with reference to a part of FIG. 3). FIG. 4 is a flow chart for explaining an example of the height measuring processing. FIGS. 5(A) to 5(C) are conceptual views for explaining the height measuring processing. FIG. 6 shows a change in the Z-direction position in the bonding tool with the passage of time.

In the height processing of the embodiment, the height measuring part 88 shown in FIG. 1 detects whether the free air ball 43 is grounded to the electrodes 112 and 122, respectively, based on a change in the moving speed of the bonding tool 40 when the free air ball 43 at the front end of the wire 42 contacts the electrode 112 and the electrode 122, respectively.

(Step S1 of FIG. 4)
As shown in FIG. 3(A), the bonding tool 40 is disposed at the position P1 above the electrode 112 as the first bonding target to be bonded.

(Step S3)
As shown in FIG. 3(A), the bonding tool 40 is lowered toward the first bonding point P2 of the electrode 112. For example, as shown in FIG. 6, during the period from t0 to t1, the bonding tool 40 is lowered at a speed a along the Z direction.

Next, as shown in FIGS. 5(A) and 6, at the time t1, the descending speed of the bonding tool 40 is changed from the speed a to the speed b (the speed b is less than the speed a). In other words, since the bonding tool 40 approaches the first bonding point P2, the process is changed to a search operation.

Figure 5B:
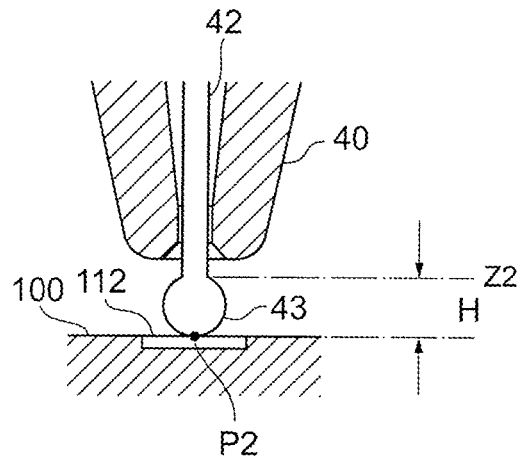
Figure 6:
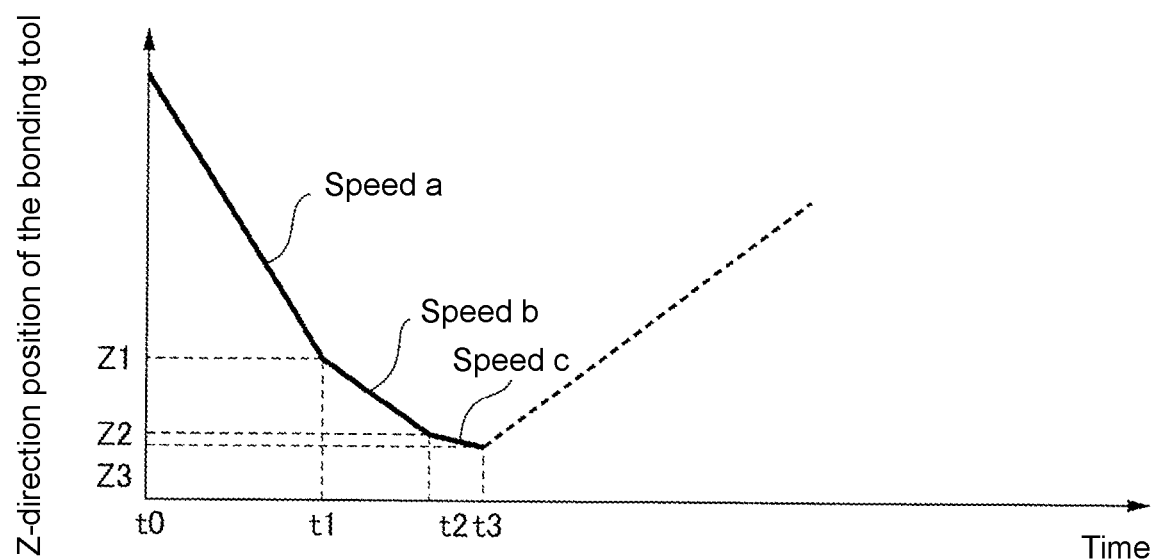
FIG. 6 is a view for explaining the height measuring processing of the wire bonding according to the first embodiment.

(Step S5)
As shown in FIGS. 5(B) and 6, at the time t2, the free air ball 43 contacts the electrode 112. Subsequently, when the free air ball 43 is pressed to the first bonding point P2, the free air ball 43 receives a reaction force from the first bonding point P2, and the descending speed of the bonding tool 40 decreases from the speed b to the speed c (the speed c is less than the speed b).

Further, for example, the height measuring part 88 detects whether the free air ball 43 is grounded to the electrode 112 based on a speed change amount (|b−c|) from the speed b to the speed c in the movement of the bonding tool 40 when the free air ball 43 at the front end of the wire 42 presses the electrode 112. Specifically, the height measuring part 88 compares the speed change amount (|b−c|) from the speed b to the speed c in the movement of the bonding tool 40 when the free air ball 43 at the front end of the wire 42 presses the electrode 112 with the speed change amount recorded in the recording part 130 as the threshold value, and the height measuring part 88 determines that the free air ball 43 has been grounded to the electrode 112 when the speed change amount (|b−c|) is greater than the speed change amount recorded in the recording part 130. In addition, the height measuring part 88 may detect whether the free air ball 43 is grounded to the electrode 112 based on that the moving speed of the bonding tool 40 when the free air ball 43 at the front end of the wire 42 presses the electrode 112 reaches a predetermined set value (such as the speed c).

Here, when the height measuring part 88 has detected the grounding of the free air ball 43 to the electrode 112 (Yes in S5 of FIG. 4), the process proceeds to the Step S7, and when the height measuring part 88 has not detected the grounding of the free air ball 43 to the electrode 112 (No in S5 of FIG. 4), the process returns to the Step S3.

(Step S7)
As shown in FIG. 5, the height measuring part 88 measures the height of the electrode 112 by detecting whether the free air ball 43 is grounded to the electrode 112. The height measuring part 88 measures the height of the electrode 112 based on, for example, the height of the position P1 set in advance before the bonding tool 40 is lowered and the height H corresponding to the position Z2 of the bonding tool 40 when the free air ball 43 is grounded to the electrode 112. Further, the height of the position P1 and height H may include the height from the surface of the bonding stage 16 of the workpiece 100, the semiconductor chip 110, or the substrate 120.

Figure 5C:
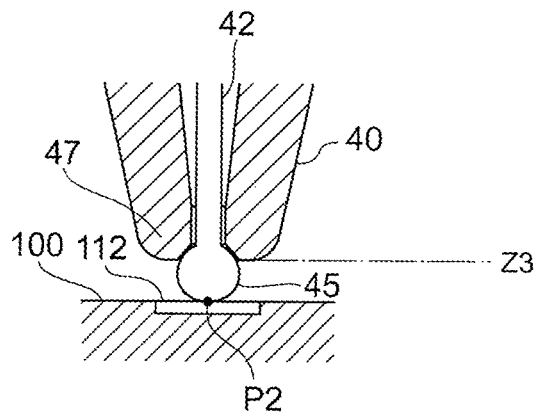

Subsequently, as shown in FIGS. 5(C) and 6, after the time t2, when the bonding tool 40 is further lowered from the position Z2, the free air ball presses the first bonding point P2 at the speed c, and a free air ball 45 is deformed as shown and is slightly flattened, and the position of the bonding tool 40 reaches Z3.

(Step S9)
As shown in FIGS. 3(A) and 6, the bonding tool 40 is moved to the position P1 above the first bonding point P2 at a predetermined speed. Then, though not shown in FIG. 4, as shown in FIGS. 3(B) and 3(C), the height measuring processing is performed to measure the height of the second bonding point P4 of the electrode 122.

As described above, according to the first embodiment, the height of the electrode 112 is measured by detecting whether the free air ball 43 is grounded to the electrode 112, the height of the electrode 122 is measured by detecting whether the free air ball 43 is grounded to the electrode 122, the height of the bonding tool 40 is controlled based on the measurement result of the height of the electrode 112 to bond the free air ball 43 to the electrode 112, and the height of the bonding tool 40 is controlled based on the measurement result of the height of the electrode 122 to bond the wire 42 to the electrode 122 so as to connect the electrode 112 and the electrode 122. In this way, a plurality of electrodes can be correctly bonded.

Second Embodiment

The second embodiment differs from the first embodiment in that the height measuring part 88 detects whether the free air ball at the front end of the wire is grounded to the electrodes 112 and 122 based on a change in the bonding load applied when the free air ball is grounded to the electrodes 112 and 122. Hereinafter, differences from the first embodiment will be specifically described, and other parts will be omitted.

The bonding load detection part 150 shown in FIG. 1 includes, for example, an output measuring part 152 connected to an output of the load sensor 50, and a determination part 154 for determining whether the free air ball 43 of the wire 42 is grounded to the workpiece 100 based on the result of the output measuring part 152.

The determination part 154 determines whether the free air ball 43 is grounded based on, for example, whether the output of the load sensor 50 exceeds a predetermined threshold value. That is, when the bonding tool 40 is lowered and the free air ball 43 of the wire 42 is grounded to the electrodes 112 and 122, the front end of the bonding tool 40 receives a reaction force from the electrodes 112 and 122, and the output value of the load sensor 50 rises due to the load. In addition, when the output value exceeds the predetermined threshold value, the determination part 154 determines that the free air ball 43 has been grounded. In this way, the bonding load detection part 150 detects whether the free air ball 43 is grounded during the wire bonding operation based on the initial impact load applied to the front end of the bonding tool 40 in association with the lowering of the bonding tool 40.

Figure 7:
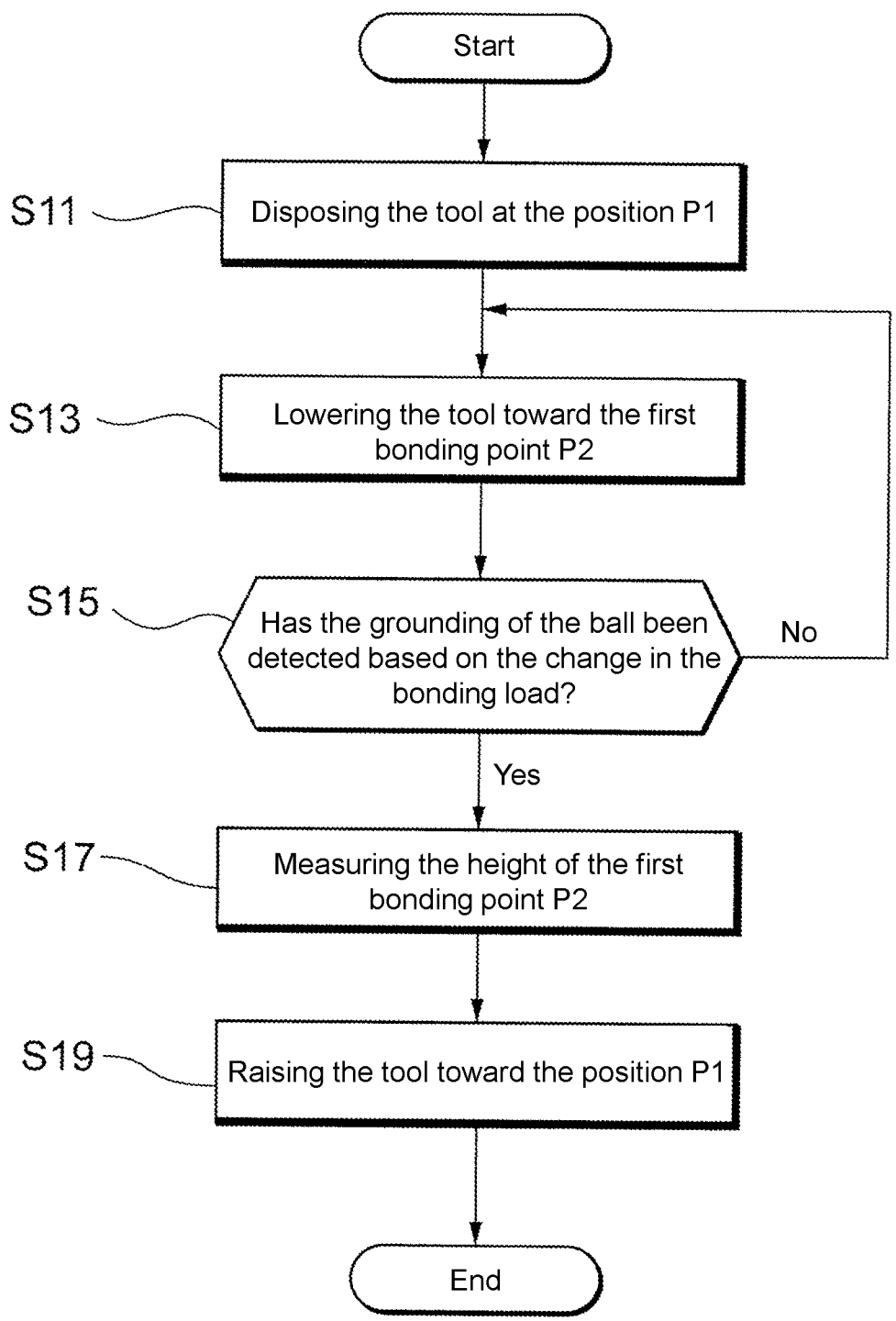
FIG. 7 is a flow chart showing an example of the height measuring processing of the wire bonding according to the second embodiment.
Figure 8:
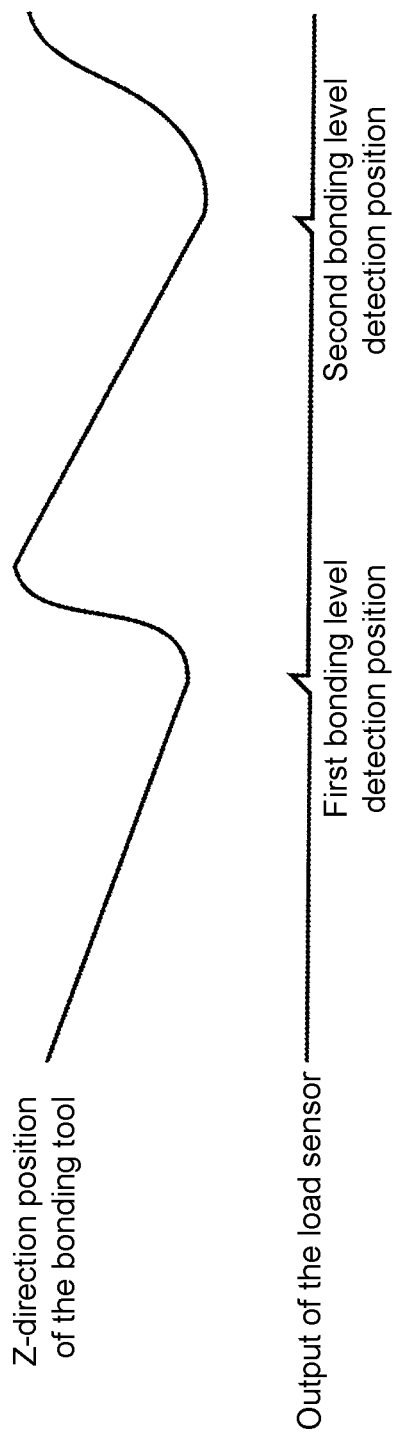
FIG. 8 is a view for explaining the height measuring processing of the wire bonding according to the second embodiment.

FIG. 7 is a flow chart showing an example of the height measuring processing of the wire bonding according to the second embodiment. FIG. 8 is a view showing a relationship between the output of the load sensor and the Z-direction position of the bonding tool according to the second embodiment.

(Step S15 of FIG. 7)

As shown in FIG. 8, the height measuring part 88 shown in FIG. 1 detects whether the free air ball 43 at the front end of the wire 42 is grounded to the electrode 112 based on the change in the output of the load sensor 50. Specifically, the height measuring part 88 detects whether the free air ball 43 at the front end of the wire 42 is grounded to the electrode 112 based on a change in the bonding load applied to the free air ball 43 when the free air ball 43 at the front end of the wire 42 presses the first bonding point P2.

(Step S17)

The height measuring part 88 shown in FIG. 1 measures the height of the electrode 112 by detecting whether the free air ball 43 is grounded to the electrode 112, and the height of the electrode 112 is based on the Z-direction position of the bonding tool 40 corresponding to a first bonding level detection position. In addition, though not shown in FIG. 7, after measuring the height of the electrode 112, the height measuring part 88 measures the height of the electrode 122 by detecting whether the free air ball 43 is grounded to the electrode 122, and the height of the electrode 122 is based on the Z-direction position of the bonding tool 40 corresponding to a second bonding level detection position.

As described above, according to the second embodiment, in addition to the effects of the first embodiment, since the height measuring part 88 detects whether the free air ball 43 is grounded to the electrode 112 based on the change in the bonding load applied to the free air ball 43 and thereby measures the height of the electrode 112, the grounding of the free air ball 43 to the electrode 112 can be more correctly detected.

Third Embodiment

The third embodiment differs from the first embodiment and the second embodiment in that the height measuring part 88 detects whether the free air ball at the front end of the wire is grounded to the electrodes 112 and 122 based on an output change in the electric signal supplied to the wire inserted in the bonding tool when the free air ball is grounded to the electrodes 112 and 122. Hereinafter, differences from the first embodiment and the second embodiment will be specifically described, and other parts will be omitted.

Figure 9:
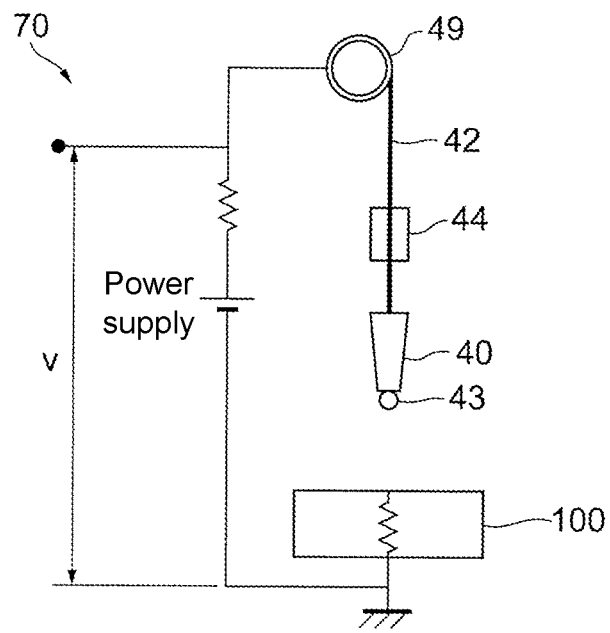
FIG. 9 is a view showing an example of a circuit configuration of a grounding detection part of the wire bonding apparatus according to the third embodiment.

FIG. 9 is a view showing an example of a circuit configuration of a grounding detection part of the wire bonding apparatus according to the embodiment. As shown in FIG. 9, the power supply part 72 of the grounding detection part 70 may be configured with a DC voltage power supply. That is, when it can be seen that the wire 42 and the bonding stage 16 are connected only by an electric resistance component (for example, when both are electrically turned on), a DC voltage signal can be used as a predetermined electric signal. That is, when the free air ball 43 of the wire 42 is in contact with the electrodes 112 and 122, a potential difference is generated between the bonding stage 16 and the wire 42. Therefore, whether the free air ball 43 is grounded to the electrodes 112 and 122 can be determined based on the change in the output voltage v.

Figure 10:
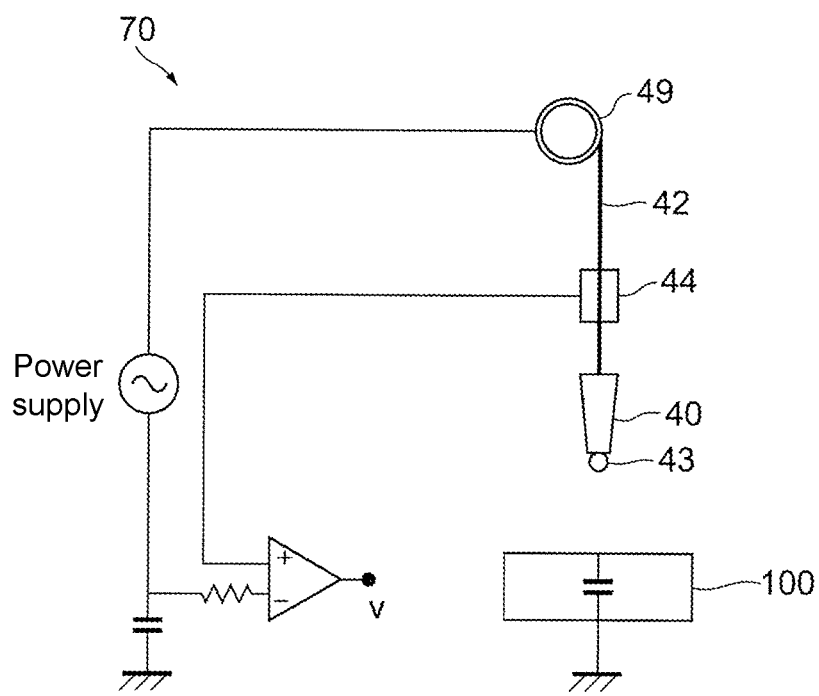
FIG. 10 is a view showing another example of a circuit configuration of a grounding detection part of the wire bonding apparatus according to the third embodiment.

FIG. 10 is a view showing an example of a circuit configuration of the grounding detection part of the wire bonding apparatus according to the embodiment. As shown in FIG. 10, the power supply part 72 of the grounding detection part 70 may be configured with an AC voltage power supply. That is, when a capacitance component is included between the electrodes 112 and 122 of the workpiece 100 and the bonding stage 16 (for example, when neither are electrically turned on), an AC voltage signal can be used as a predetermined electric signal. In this case, when the free air ball 43 of the wire 42 contacts the electrodes 112 and 122, the electrostatic capacitance value of the wire bonding apparatus 1 is further added with the electrostatic capacitance value of the workpiece 100, whereby the electrostatic capacitance value between the bonding stage 16 and the wire 42 changes. Therefore, whether the free air ball 43 is grounded to the electrodes 112 and 122 can be determined based on the change in the capacity value, such as the output voltage v.

Figure 11:
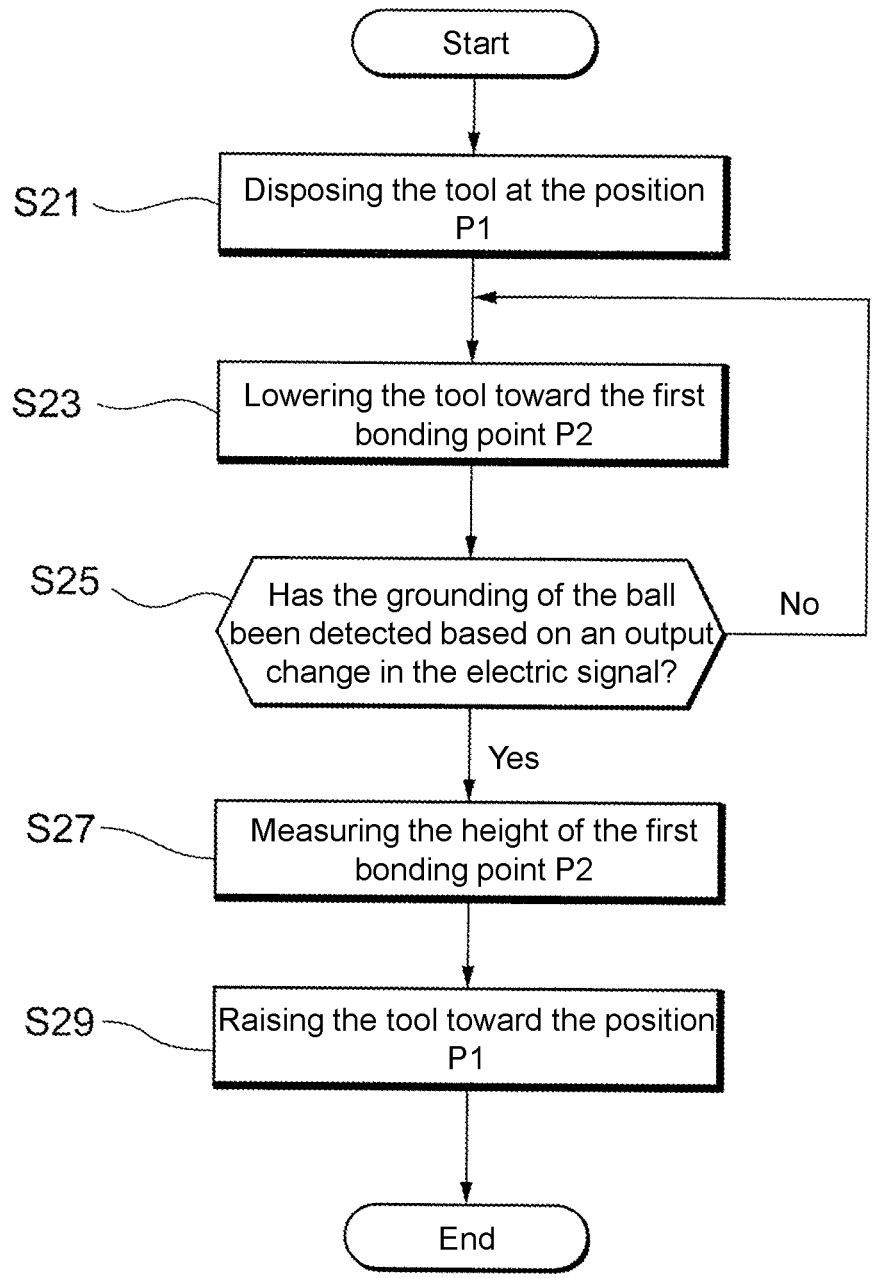
FIG. 11 is a flow chart showing an example of the height measuring processing of the wire bonding according to the third embodiment.
Figure 12:
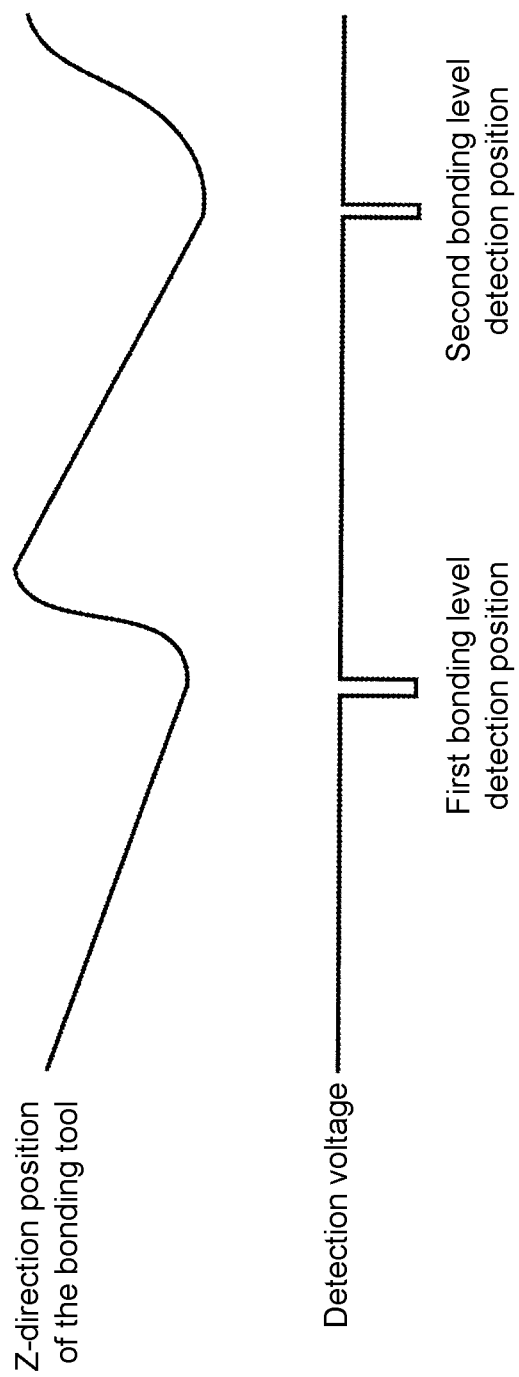
FIG. 12 is a view for explaining the height measuring processing of the wire bonding according to the third embodiment.

FIG. 11 is a flow chart showing an example of the height measuring processing of the wire bonding according to the third embodiment. FIG. 12 is a view showing a relationship between the detection voltage of the grounding detection part and the Z-direction position of the bonding tool according to the third embodiment.

(Step S25)

As shown in FIG. 8, the height measuring part 88 detects whether the free air ball 43 at the front end of the wire 42 is grounded to the electrode 112 based on the detection voltage of the grounding detection part 150 shown in FIG. 1. Specifically, the height measuring part 88 detects whether the free air ball 43 at the front end of the wire 42 is grounded to the electrode 112 based on an output change in the electric signal supplied to the wire 42 inserted in the bonding tool 40 when the free air ball 43 at the front end of the wire 42 contacts the first bonding point P2 of the electrode 112.

(Step S27)

The height measuring part 88 measures the height of the electrode 112 corresponding to the first bonding level detection position by detecting whether the free air ball 43 is grounded to the electrode 112. In addition, though not shown in FIG. 11, after measuring the height of the electrode 112, the height measuring part 88 measures the height of the electrode 122 by detecting whether the free air ball 43 is grounded to the electrode 122, and the height of the electrode 122 is based on the Z-direction position of the bonding tool 40 corresponding to the second bonding level detection position.

As described above, according to the third embodiment, in addition to the effects of the first embodiment, since the height measuring part 88 detects whether the free air ball 43 is grounded to the electrode 112 based on the output change in the electric signal supplied to the wire 42, the grounding of the free air ball 43 to the electrode 112 can be detected more quickly and correctly.

OTHER EMBODIMENTS

The embodiment examples or application examples described in the embodiments of the present invention may be appropriately combined according to the purpose or may be used with change or modification. The present invention is not limited to the description of the embodiments. It is to be understood that such combinations or changes or modifications are also included in the technical scope of the present invention.

In the wire bonding apparatus, the first embodiment to the third embodiment can be combined as appropriate and implemented by combining the speed detection part 86, the grounding detection part 70, the load sensor 50, and the bonding load detection part 150. On the other hand, in the wire bonding apparatus, it is not necessary to include all of the speed detection part 86, the grounding detection part 70, the load sensor 50, and the bonding load detection part 150. For example, in the first embodiment, the wire bonding apparatus is required to include the speed detection part 86, however, the grounding detection part 70, the load sensor 50, and the bonding load detection part 150 are not necessarily required. In the second embodiment, the wire bonding apparatus is required to include the load sensor 50 and the bonding load detection part 150; however, the speed detection part 86 and the grounding detection part 70 are not necessarily required. In the third embodiment, the wire bonding apparatus is required to include the grounding detection part 70; however, the speed detection part 86, the load sensor 50, and the bonding load detection part 150 are not necessarily required.

In the above-described embodiment, an aspect in which a plurality of bonding targets disposed at different positions are connected to each other by a wire is described as an example of the wire bonding method. However, the heights of the plurality of bonding targets may be different, or at least two of the plurality of bonding targets may have the same height.

Further, the present invention can also be applied to so-called reverse bonding in which the first bonding point P1 is set as the electrode 122 of the substrate 120.

Figure 13:
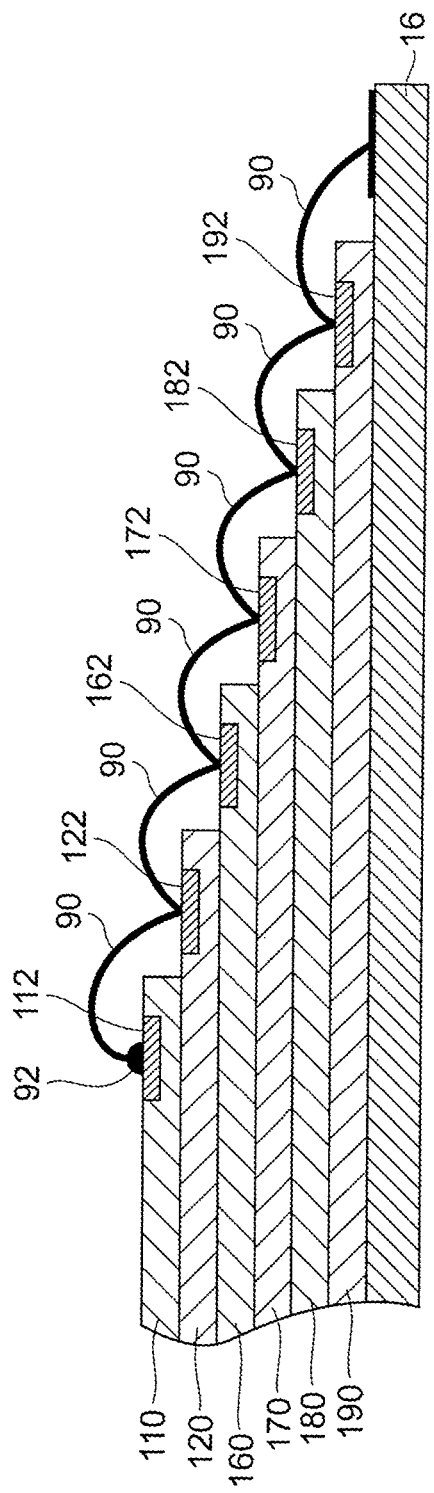
FIG. 13 is a view showing an example of a configuration of a wire bonding apparatus according to another embodiment.

FIG. 13 is a view for explaining another wire bonding method. As shown in FIG. 13, the present invention can also be applied to a so-called chain loop; that is, a wire loop 90 is formed by a single wire to connect a plurality of electrodes 112, 122, 162, 172, 182 and 192 respectively disposed on a plurality of chips (or substrates) 110, 120, 160, 170, 180 and 190.

DESCRIPTION OF REFERENCE NUMERALS

1: wire bonding apparatus
30: ultrasonic horn
40: bonding tool
42: wire
43 (143): free air ball
70: grounding detection part
80: control part
150: bonding load detection part

What is claimed is:

1. A wire bonding method, comprising:
  a step of preparing a wire bonding apparatus comprising a bonding tool and a bonding stage, wherein the bonding tool is configured to allow a wire to be inserted, and the bonding stage fixes and holds a workpiece comprising a first electrode and a second electrode;
  a ball forming step of forming a free air ball at a front end of a wire inserted in the bonding tool;
  a first height measuring step of measuring a height of the first electrode by detecting whether the free air ball is grounded to the first electrode;
  a second height measuring step of measuring a height of the second electrode by detecting whether the free air ball is grounded to the second electrode;
  a first bonding step of bonding the free air ball to the first electrode by controlling a height of the bonding tool based on a measurement result of the first height measuring step; and
  a second bonding step of bonding the wire to the second electrode by controlling a height of the bonding tool based on a measurement result of the second height measuring step to connect the first electrode and the second electrode.

2. The wire bonding method according to claim 1, wherein
  the first height measuring step and the second height measuring step comprise: detecting whether the free air ball at the front end of the wire is grounded to the first electrode and the second electrode, respectively, based on a change in a bonding load applied to the free air ball when the free air ball at the front end of the wire presses the first electrode and the second electrode, respectively.

3. The wire bonding method according to claim 1, wherein
  the first height measuring step and the second height measuring step comprise: detecting whether the free air ball at the front end of the wire is grounded to the first electrode and the second electrode, respectively, based on an output change in a predetermined electric signal supplied to the wire inserted in the bonding tool when the free air ball at the front end of the wire contacts the first electrode and the second electrode, respectively.

4. The wire bonding method according to claim 3, wherein
the predetermined electric signal is a DC voltage signal or an AC voltage signal, and
the first height measuring step and the second height measuring step comprise: detecting whether the free air ball at the front end of the wire is grounded to the first electrode and the second electrode based on a change in a potential difference between the wire and the first electrode and between the wire and the second electrode.

5. A wire bonding apparatus, comprising:
a bonding tool configured to allow a wire to be inserted, wherein a free air ball is formed at a front end of the wire;
a bonding stage for fixing and holding a workpiece which comprises a first electrode and a second electrode;
a first height measuring part for measuring a height of the first electrode by detecting whether the free air ball is grounded to the first electrode;
a second height measuring part for measuring a height of the second electrode by detecting whether the free air ball is grounded to the second electrode;
a first bonding part for bonding the free air ball to the first electrode by controlling a height of the bonding tool based on a measurement result of the first height measuring part; and
a second bonding part for bonding the wire to the second electrode by controlling a height of the bonding tool based on a measurement result of the second height measuring part to connect the first electrode and the second electrode.

6. The wire bonding apparatus according to claim 5, wherein
the first height measuring part and the second height measuring part detect whether the free air ball at the front end of the wire is grounded to the first electrode and the second electrode, respectively, based on a change in a bonding load applied to the free air ball when the free air ball presses the first electrode or the second electrode.

7. The wire bonding apparatus according to claim 5, wherein
the first height measuring part and the second height measuring part detect whether the free air ball at the front end of the wire is grounded to the first electrode and the second electrode, respectively, based on an output change in a predetermined electric signal supplied to the wire inserted in the bonding tool when the free air ball contacts the first electrode or the second electrode, respectively.

8. The wire bonding apparatus according to claim 7, wherein
the predetermined electric signal is an AC voltage signal, and
the first and the second height measuring parts respectively detect whether the free air ball at the front end of the wire is grounded to the first electrode and the second electrode based on a change in a potential difference between the wire and the first electrode and between the wire and the second electrode.

9. The wire bonding method according to claim 2, wherein
the first height measuring step and the second height measuring step comprise: detecting whether the free air ball at the front end of the wire is grounded to the first electrode and the second electrode, respectively, based on an output change in a predetermined electric signal supplied to the wire inserted in the bonding tool when the free air ball at the front end of the wire contacts the first electrode and the second electrode, respectively.

10. The wire bonding method according to claim 9, wherein
the predetermined electric signal is a DC voltage signal or an AC voltage signal, and
the first height measuring step and the second height measuring step comprise: detecting whether the free air ball at the front end of the wire is grounded to the first electrode and the second electrode based on a change in a potential difference between the wire and the first electrode and between the wire and the second electrode.

11. The wire bonding apparatus according to claim 6, wherein
the first height measuring part and the second height measuring part detect whether the free air ball at the front end of the wire is grounded to the first electrode and the second electrode, respectively, based on an output change in a predetermined electric signal supplied to the wire inserted in the bonding tool when the free air ball contacts the first electrode or the second electrode, respectively.

12. The wire bonding apparatus according to claim 11, wherein
the predetermined electric signal is an AC voltage signal, and
the height measuring parts detect whether the free air ball at the front end of the wire is grounded to the first electrode and the second electrode based on a change in a potential difference between the wire and the first electrode and between the wire and the second electrode.

* * * * *